US008454101B2

(12) United States Patent
Kuo

(10) Patent No.: US 8,454,101 B2
(45) Date of Patent: Jun. 4, 2013

(54) WATERPROOF ASSEMBLY FOR ELECTRONIC DEVICE AND WATERTIGHT DOOR THEREOF

(75) Inventor: Hsiu-Yu Kuo, Hsinchu (TW)

(73) Assignee: Getac Technology Corporation, Hsinchu (TW)

( * ) Notice: Subject to any disclaimer, the term of this patent is extended or adjusted under 35 U.S.C. 154(b) by 612 days.

(21) Appl. No.: 12/482,469

(22) Filed: Jun. 11, 2009

(65) Prior Publication Data
US 2010/0313485 A1 Dec. 16, 2010

(51) Int. Cl.
| A47B 95/00 | (2006.01) |
| B65D 51/00 | (2006.01) |
| B65D 43/04 | (2006.01) |
| F16J 15/02 | (2006.01) |

(52) U.S. Cl.
USPC ............ 312/296; 220/377; 220/804; 277/641

(58) Field of Classification Search
USPC ................. 312/296, 223.2, 327, 328; 277/50, 277/934, 641, 619; 220/377, 378, 801, 803, 220/804
See application file for complete search history.

(56) References Cited

U.S. PATENT DOCUMENTS

| 2,859,061 A | * | 11/1958 | Reid ............................. 277/434 |
| 3,142,001 A | * | 7/1964 | Spencer et al. ............... 361/667 |
| 3,162,106 A | * | 12/1964 | Opl ................................. 396/29 |
| 3,193,132 A | * | 7/1965 | Gray ............................. 220/3.8 |
| 3,467,395 A | * | 9/1969 | Yoshiro ......................... 277/551 |
| 3,945,329 A | * | 3/1976 | Bywater ......................... 109/68 |
| 4,031,312 A | * | 6/1977 | Coleman et al. ............... 174/542 |
| 4,456,144 A | * | 6/1984 | Imhof ............................ 220/222 |
| 4,654,470 A | * | 3/1987 | Feldman et al. ................. 174/50 |
| 4,803,504 A | * | 2/1989 | Maeno et al. ..................... 396/29 |
| 5,075,373 A |   | 12/1991 | Takemori et al. |
| 5,096,206 A | * | 3/1992 | Andre et al. ................... 277/314 |
| 5,255,965 A | * | 10/1993 | Chen et al. ..................... 312/7.1 |
| 5,258,794 A | * | 11/1993 | Woltz et al. .................... 396/414 |
| 5,294,988 A | * | 3/1994 | Wakabayashi et al. ........ 348/373 |
| 5,305,032 A | * | 4/1994 | Arai ................................ 396/27 |
| 5,310,075 A | * | 5/1994 | Wyler .......................... 220/4.02 |
| 5,435,641 A | * | 7/1995 | Dumon Dupuis et al. . 312/223.1 |
| 5,571,023 A | * | 11/1996 | Anthony ....................... 439/142 |
| 5,650,591 A | * | 7/1997 | Matsushita et al. ........ 174/17 VA |
| 5,669,019 A | * | 9/1997 | Woltz et al. ..................... 396/25 |
| 5,689,089 A | * | 11/1997 | Polak et al. .................... 174/536 |

(Continued)

FOREIGN PATENT DOCUMENTS

| CN | 2408140 Y | 11/2000 |
| CN | 2667124 Y | 12/2004 |
| TW | 200722963 | 6/2007 |

*Primary Examiner* — Darnell Jayne
*Assistant Examiner* — Kimberley S Wright

(57) ABSTRACT

A waterproof assembly for an electronic device includes a watertight door and a case. The watertight door includes a cover, a water absorbing ring, and a water blocking ring. The cover is provided for being disposed into an opening of the case. The water absorbing ring and the water blocking ring are disposed between an outer peripheral surface of the cover and an inner peripheral surface defining the opening. The water absorbing ring includes deformable material and water absorbent, such that the water absorbing ring expands by absorbing water and contacts the inner and outer peripheral surfaces. The water blocking ring is normally compressed and contacts the inner and outer peripheral surfaces. When water penetrating occurs, the water block ring blocks water preliminarily, and then the water absorbing ring block blocks fully water after completely expanding.

20 Claims, 14 Drawing Sheets

U.S. PATENT DOCUMENTS

| | | | | |
|---|---|---|---|---|
| 5,852,077 | A | 12/1998 | Zawada et al. | |
| 5,938,210 | A * | 8/1999 | Schatzle | 277/650 |
| 5,942,728 | A * | 8/1999 | Chen | 174/652 |
| 6,053,003 | A * | 4/2000 | Song et al. | 62/285 |
| 6,059,141 | A * | 5/2000 | Wojnowski | 220/849 |
| 6,296,336 | B1 * | 10/2001 | Hattori | 312/296 |
| 6,309,257 | B1 * | 10/2001 | Huang | 439/731 |
| 6,443,644 | B1 * | 9/2002 | Takeda et al. | 400/490 |
| 6,641,317 | B1 * | 11/2003 | Tsau | 400/496 |
| 6,644,874 | B2 * | 11/2003 | Tsai | 400/490 |
| 7,576,972 | B2 * | 8/2009 | Savary et al. | 361/519 |
| 7,625,119 | B2 * | 12/2009 | Szczesuil et al. | 383/41 |
| 7,628,113 | B2 * | 12/2009 | Pallo et al. | 109/75 |
| 8,089,757 | B2 * | 1/2012 | Chen et al. | 361/679.56 |
| 2001/0040037 | A1 * | 11/2001 | Negishi | 174/17 CT |
| 2004/0089570 | A1 * | 5/2004 | Chien et al. | 206/320 |
| 2007/0074473 | A1 * | 4/2007 | Yamaguchi et al. | 52/302.1 |
| 2011/0133409 | A1 * | 6/2011 | Shibuya | 277/312 |

* cited by examiner

WATERPROOF ASSEMBLY FOR ELECTRONIC DEVICE AND WATERTIGHT DOOR THEREOF

BACKGROUND OF THE INVENTION

1. Field of the Invention

The present invention relates to a waterproof assembly, and more particularly to a waterproof assembly for sealing an opening of a case of an electronic device.

2. Related Art

A portable electronic device for being operated outdoor, such as a rugged laptop computer, is often sprayed by water occasionally under adverse circumstances. Therefore, a portable electronic device or a rugged laptop computer must be waterproof, so as to preventing water from entering the interior of the device to short the electronic components and to damage the device.

Generally, water entering a portable electronic device occurs in two ways. For one way, a case of the portable electronic device is combined by a plurality of members, so that slits may be generated on junctions between adjacent members, and thus water may run through the slits. For the other way, openings must be opened in the case, for disposing electrical connectors and sockets, such that water may run through the openings, the electrical connectors, and the electrical sockets.

Accordingly, waterproof implementation on the junctions between the members on the case aims at reducing tolerance of the members, enhancing a junction force between the members, such that the junctions between the members are more tightly fitted. An adhesive, seal ring, foaming material or the like is filled in the junctions, so as to eliminate any possible slit, thereby preventing the water from entering through the junctions. Different water-absorbent filling materials are introduced in the art. For example, compounds as disclosed in U.S. Pat. No. 5,852,077 and U.S. Pat. No. 5,075,373, are further filled in the pores where water leakage may occur, so as to absorb and block the water, thereby preventing the water from entering the case. Furthermore, as disclosed in ROC Patent Publication No. 200722963, a water absorbent member is fixed on an inner side of the case, so as to further absorb the water accidentally entering into the case, thereby protecting the electronic device from being damaged by the water once a waterproofing function of the case fails. However, the above waterproofing implementation is semi-permanent, and the waterproofing implementation will failed when the case is dismounted.

For the connectors, sockets, and the openings corresponding to the connectors and the sockets, the aforementioned semi-permanent waterproofing implementation cannot be applied at all. The openings are opened whenever necessary, so as to enable external electrical contactors to be connected to the connectors and sockets of the electronic device. The waterproofing implementation on an opening is to seal the opening with a cover, and the cover body is removed when the opening is required to be opened.

Referring to FIG. 1, in the prior art, a cover body 2 used to seal an opening 1 is shown. An elastic ring 3 is fitted to an outer peripheral surface of the cover body 2. When the cover body 2 is placed into the opening 1, the elastic ring 3 is pressed against an inner wall of the opening and is deformed, so as to block the water from passing through the gap between the outer peripheral surface of the cover body 2 and the inner peripheral surface of the opening 1.

Referring to FIG. 2, another cover body 5 used to seal an opening 4 in the prior art is shown. The cover body 5 is made of elastic material, and an outer diameter thereof is larger than an inner diameter of the opening 4. When the cover body 5 is placed into the opening 4, the cover body 5 is compressed and deformed, so as to closely contact an inner wall of the opening 4 to block the water from passing through the gap between the outer peripheral surface of the cover body and the inner peripheral surface of the opening 4.

In FIGS. 1 and 2, when the cover bodies 2 and 5 are not properly mounted (for example, the cover bodies are not mounted on correct positions), or the element made of an elastic material is broken, the water still runs through the gaps between the cover bodies 2 and 5 and the openings 1 and 4, so as to directly result in a short circuit of the electrical connectors or the sockets, and further damage the electronic device when water enters the case.

In addition, the waterproofing effect depends on a contact pressure among the elastic sleeve ring 3, the cover body 5, and the openings 1 and 4. When a large contact pressure is provided, the waterproofing effect is improved. However, if a large contact pressure is provided, the difficulty for mounting and dismounting the cover bodies 2 and 5 is increased, and the elastic sleeve ring 3 or the cover body 5 made of the elastic material is easily broken. If the contact pressure is small, the waterproofing effect is distinctly poor. Therefore, it becomes a technical problem how to modify the waterproofing measures on the electrical connection ports and corresponding openings when the rugged laptop computer and other portable electronic devices are fabricated.

SUMMARY OF THE INVENTION

To achieve the aforementioned problems, a waterproof assembly of the present invention is introduced, which has long life span and provides well waterproofing effect.

The present invention provides a waterproof assembly including a case, a cover, a water absorbing ring, a water blocking ring. The case has an outer surface with an opening formed thereon, wherein the opening is defined by an inner peripheral surface. The cover is provided for being disposed into the opening, and has a water blocking surface and an outer peripheral surface surrounding the water blocking surface. When the cover is placed in the opening, the outer peripheral surface overlaps the inner peripheral surface of the opening and the water blocking surface is located corresponding to the outer surface of the case. The water absorbing ring is located between the outer peripheral surface and the inner peripheral surface, and made of deformable material and water absorbent, for absorbing water to expand and tightly contacting the inner peripheral surface and the outer peripheral surface. The water blocking ring is made of an elastic material, and is located between the outer peripheral surface and the inner peripheral surface to be normal compressed to contact the inner peripheral surface and the outer peripheral surface when the cover is placed in the opening. The distance form the water blocking ring to the water blocking surface is larger than that from the water absorbing ring to the water blocking surface. When water enters the gaps between the outer peripheral surface of the cover and the inner peripheral surface of the opening, the water blocking ring blocks the water at first and then the water absorbing ring absorbs the water to fully expand. Finally, the fully expanding water absorbing ring blocks the water effectively.

The water absorbing ring expands after absorbing the water. Therefore, the water absorbing ring would not easily be damage when placing the cover into the opening, so as to maintain waterproofing effect of the water absorbing ring.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1:
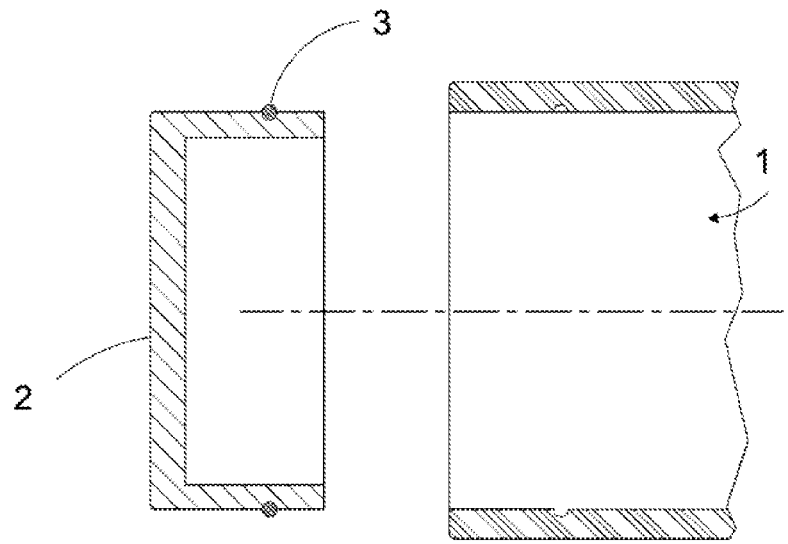
FIG. 1 is a cross-sectional view of a waterproof assembly in the prior art.
Figure 2:
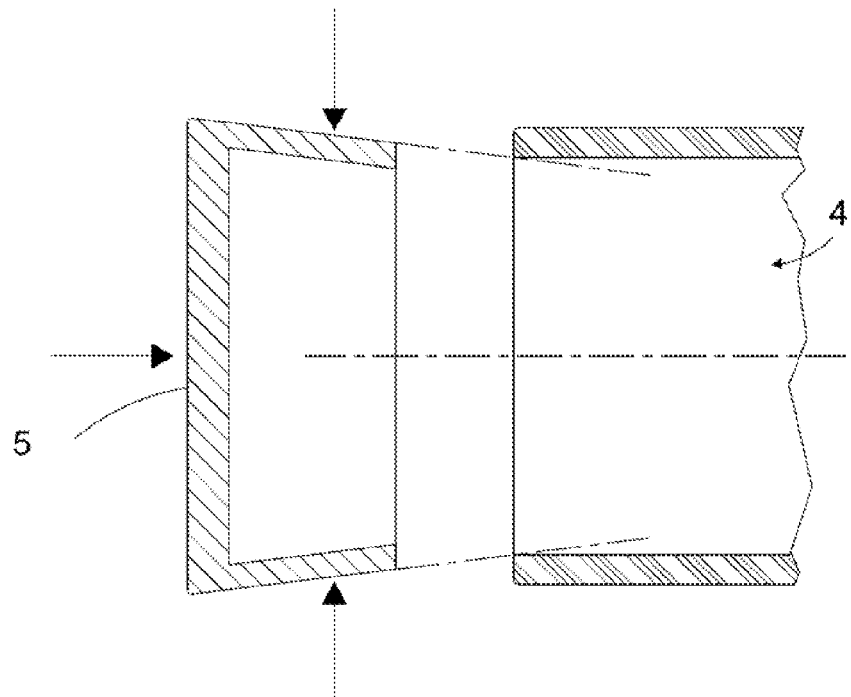
FIG. 2 is a cross-sectional view of another waterproof assembly in the prior art.
Figure 3:
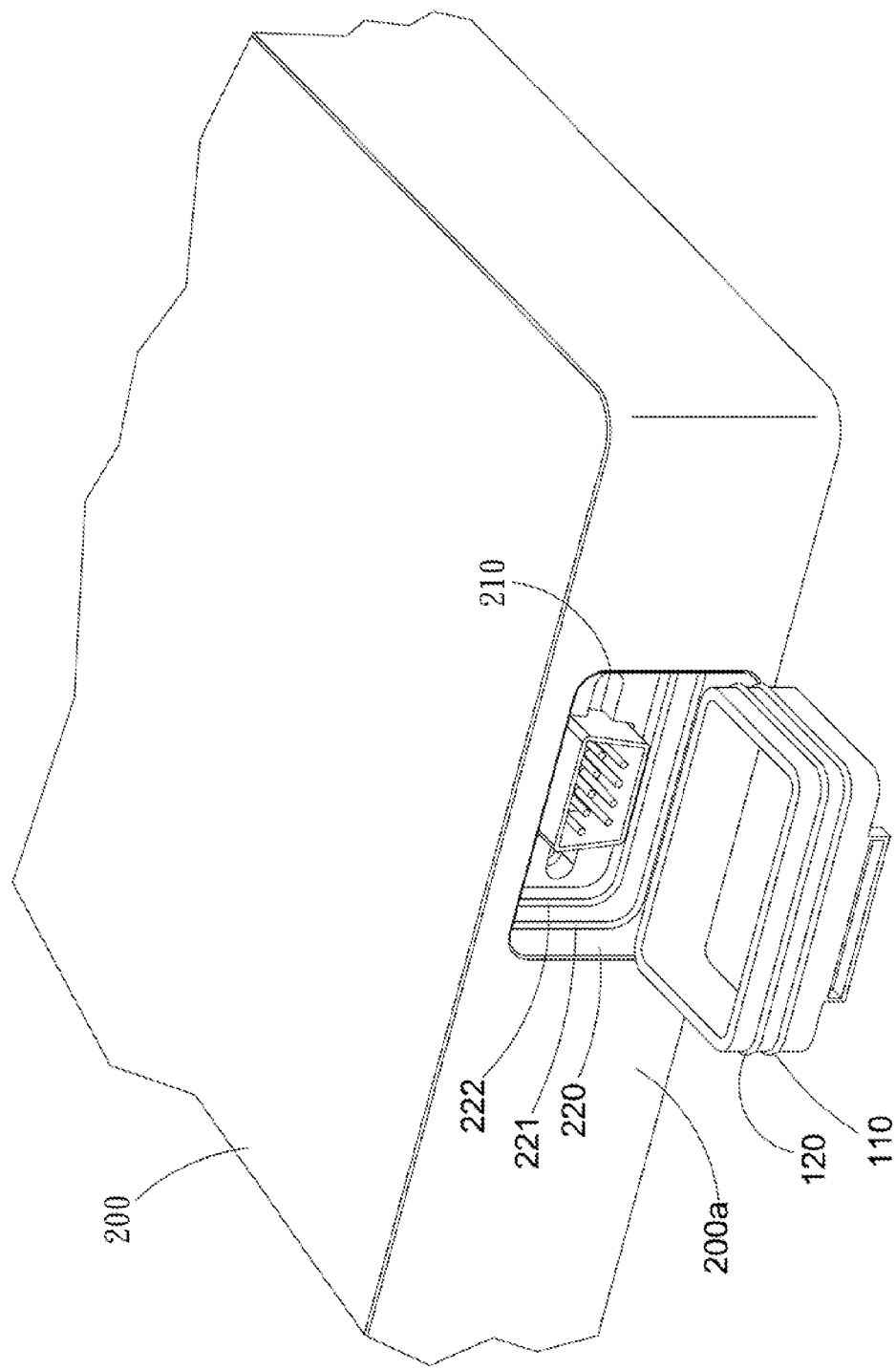
FIGS. 3 and 4 are perspective views of a waterproof assembly according to a first embodiment of the present invention, in which an opening state and a closed state of a watertight door are shown.
Figure 4:
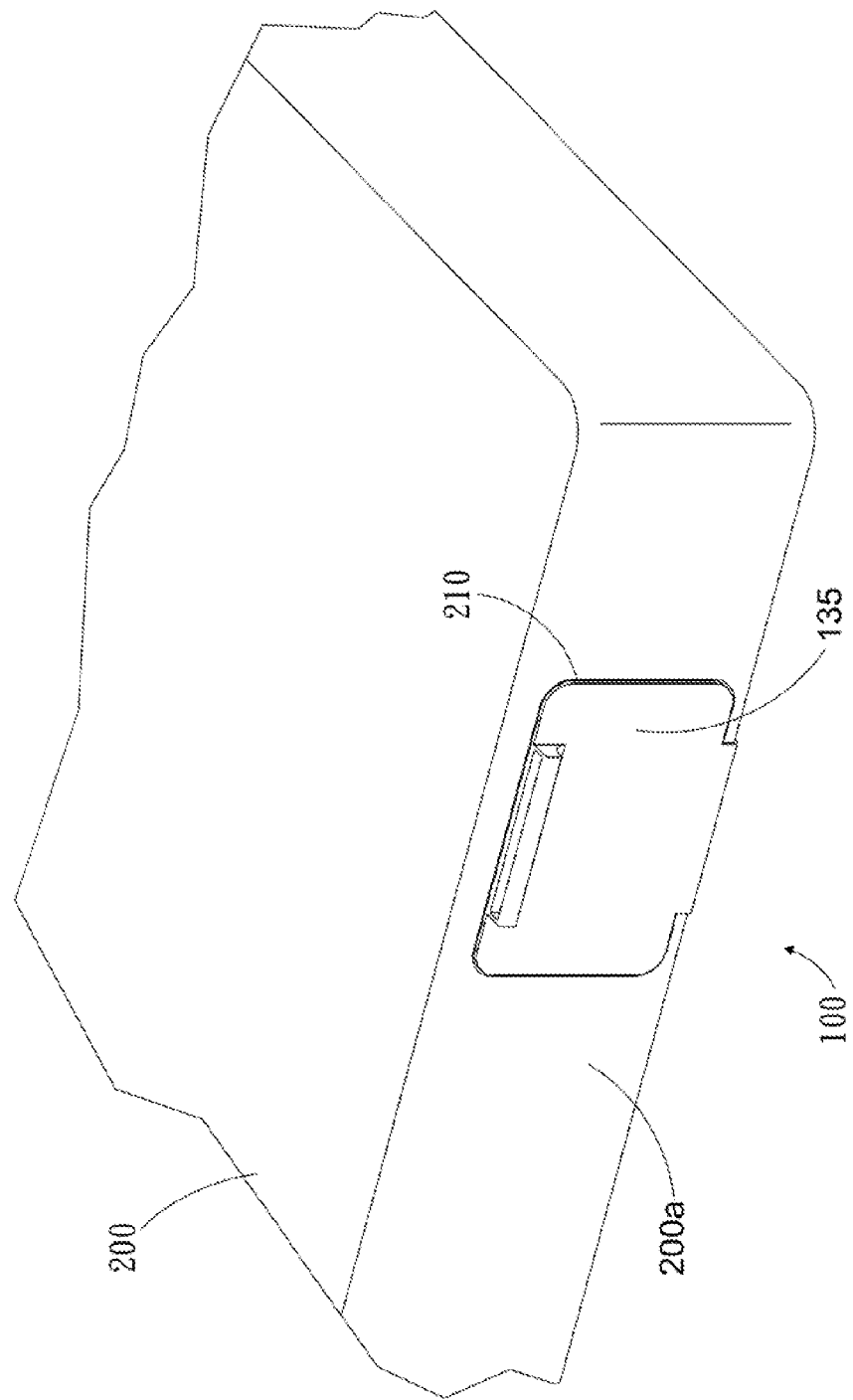

Referring to FIGS. 3 and 4, a waterproof assembly according to a first embodiment of the present invention is shown. The waterproof assembly includes a watertight door 100 and a case 200 of an electronic device. The case 200 has an outer surface 200a. An opening 210 is formed on the outer surface 200a, the opening 210 is surrounded and defined by an inner peripheral surface 220. The inner peripheral surface 220 includes a first annular groove 221 and a second annular groove 222 formed thereon. The distance from the first annular groove 221 to the outer surface 200a is smaller the distance from the second annular groove 222 to the outer surface 200a. The watertight door 100 is provided for being disposed into in the opening 210, so as to seal the opening 210. Keys, switches, electrical contacts, removable storage medium device (for example, an optical disc drive), and other electronic components of the electronic device may be disposed in the case 200 via the opening 210. The watertight door 100 is used to seal the opening 210, so as to prevent water or dust from damaging the electronic components.

Referring to FIGS. 3, 4, 5, and 6, the watertight door 100 includes a water absorbing ring 110, a water blocking ring 120, and an cover 130.

Figure 5:
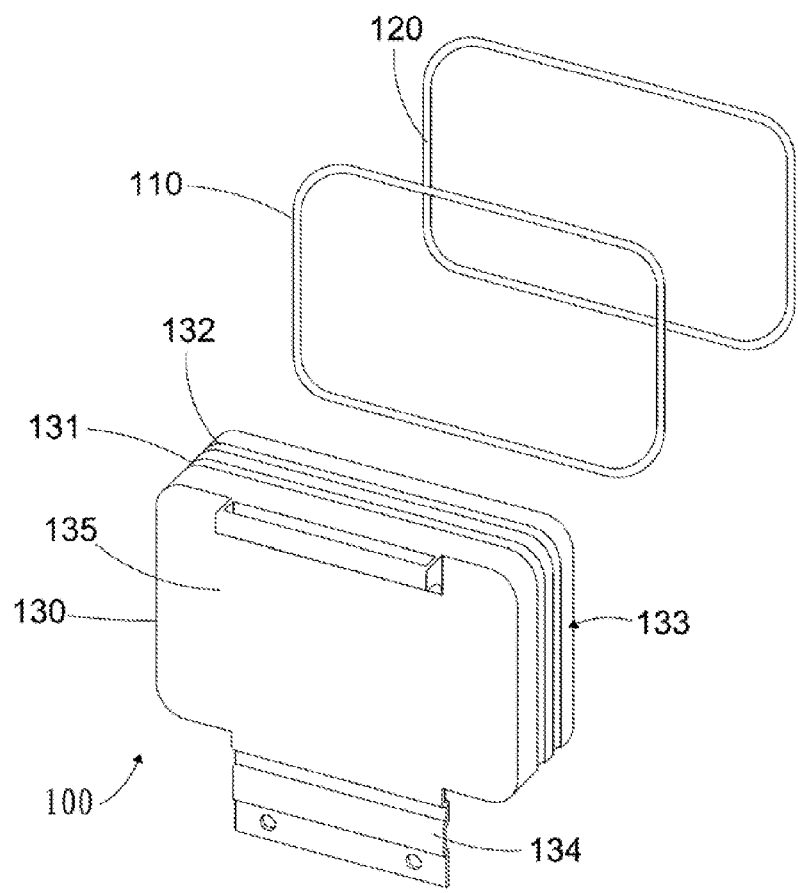
FIG. 5 is an exploded view of the watertight door according to the first embodiment of the present invention.
Figure 6:
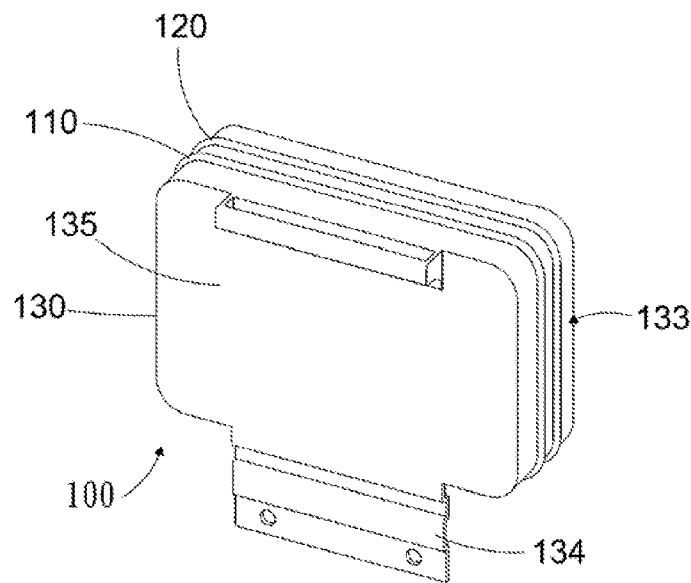
FIG. 6 is a perspective view of the watertight door according to the first embodiment of the present invention.

Referring to FIGS. 5 and 6, the cover 130 includes a water blocking surface 135 and a outer peripheral 133 surrounding the water blocking surface 135. The outer peripheral 133 includes a first annular track 131 and a second annular track 132, wherein the first annular track 131 is relatively located near the water blocking surface 135 while the second annular track 132 is relatively located distant from the water blocking surface 135. The cover 130 is movably connected to the case 200 via a connecting piece 134, such that the cover 130 is limitedly moved relative to the opening 210 of the case 200, or is pivoted to an edge of the opening 210. The connecting piece 134 may be a component including at least one flexible piece, or may be a hinge. The cover 130 is provided to be moved relative to the opening 210, and is disposed into the opening 210. When the cover 130 is disposed into the opening 210, the outer peripheral surface 133 of the cover 130 coincides with the inner peripheral surface 220 of the opening 210, and the water blocking surface 135 is located corresponding to the outer surface 200a of the case 200. In the meanwhile, the cover 130 located in the opening 210 seals the opening 210, thereby protecting the electronic components exposed through the opening 210.

Referring to FIGS. 4 and 5, the water absorbing ring 110 is fitted to the outer peripheral surface 133 of the cover 130, and is fixed in the first annular track 131, such that the water absorbing ring 110 is fixed on the outer peripheral surface 133. The water blocking ring 120 is fitted to the outer peripheral surface 133 of the cover 130, and is fixed in the second annular track 132, such that the water blocking ring 120 is fixed on the outer peripheral surface 133. Through the arrangement of the first annular track 131 and the second annular track 132, the distance from the water blocking ring 120 to the water blocking surface 135 is larger than the distance from the water absorbing ring 110 to the water blocking surface 135. Therefore, the water absorbing ring 110 is relatively located near the water blocking surface 135, while the water blocking ring 120 is relatively located distant from the water blocking surface 135. When the cover 130 is disposed into the opening 210, the water absorbing ring 110 is located relatively outside while the water blocking ring 120 is located relatively inside.

The water absorbing ring 110 includes deformable material and water absorbent. The deformable material is deformed after being applied with an external force. The water absorbent, for example, an absorbent polymer (e.g., sodium polyacrylate and polyacrylate) may continuously absorb the water to reach a saturation state and to be expanded. The water absorbing ring 110 having the water absorbent may be expanded after absorbing the water and the water absorbent continuously absorb the water before becoming saturated. After fully mixing the deformable material with the water absorbent, the deformable material and water absorbent are formed into the water absorbing ring 110. During the process of forming the water absorbing ring 110, the deformable material is further formed into porous structure, so as to enable the water to permeate the water absorbing ring 110 and to be absorbed by the water absorbent.

Figure 7:
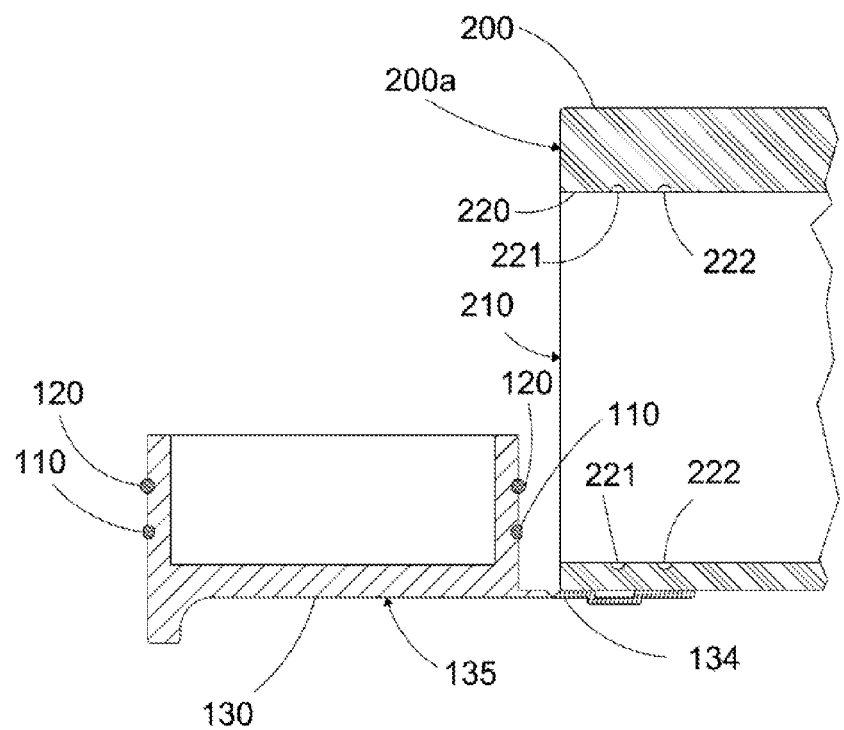
FIG. 7 is a cross-sectional view of the watertight door and a case according to the first embodiment of the present invention, in which the opening state of the watertight door is shown.
Figure 8:
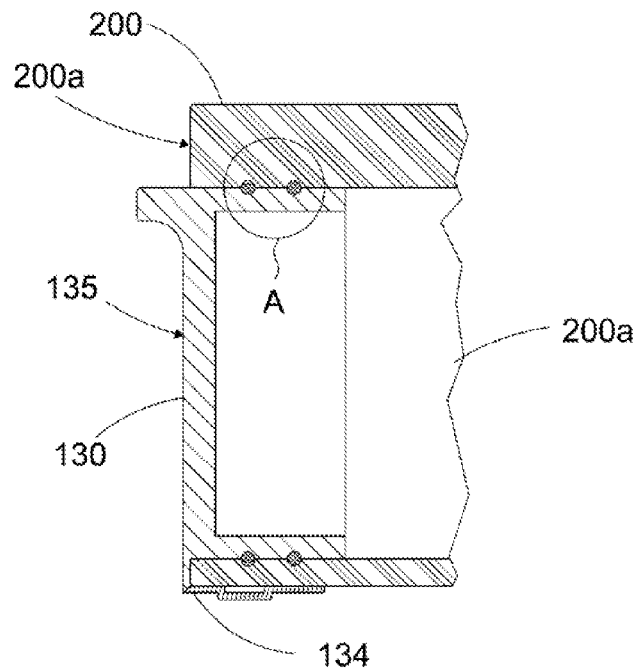
FIG. 8 is a cross-sectional view of the watertight door and the case according to the first embodiment of the present invention, in which the closed state of the watertight door is shown.
Figure 9:
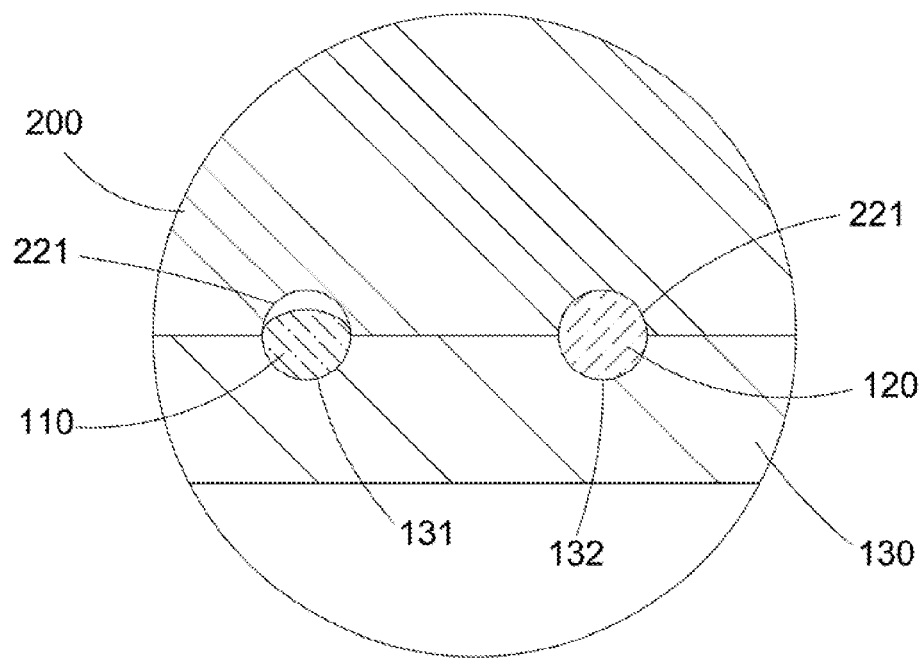
FIG. 9 is a enlarged view of Region A in FIG. 8, in which a state of a water absorbing ring before absorbing water is shown.

Referring to FIGS. 7, 8, and 9, when the cover 130 is disposed into the opening 210, the inner peripheral surface 220 overlaps the outer peripheral surface 133 of the cover 130 and surrounds the cover 130. And the water blocking surface 135 is located corresponding to the outer surface 200a of the case 200, (the water blocking surface 135 is parallel to, slight rising from, or slight depressed on the outer surface 200a.) In this case, the first annular track 131 coincides with the first annular groove 221, so as to together form a pipe-shaped space of a closed path. The water absorbing ring 110 is located between the outer peripheral surface 133 and the inner peripheral surface 220, and is filled in the pipe-shaped space formed by the first annular track 131 and the first annular groove 221. Before the water absorbing ring 110 absorbs the water, the water absorbing ring 110 does not expand Therefore, the first annular groove 221 is not fully filled up with the water absorbing ring 110. That is, before the water absorbing ring 110 absorbs the water and expands, a cross-sectional area of a part of the water absorbing ring 110 raising from the outer peripheral surface 133 of the cover 130 is smaller than that of the first annular groove 221, such that the part of the water absorbing ring 110 raising from the outer peripheral surface 133 is located in the first annular groove 221 and is not compressed. And the water may run over the water absorbing ring 110.

The water blocking ring 120 is made of elastic material. The elastic material may be rubber, silica gel, and other materials capable of restoring the original shape after being compressed to be deformed. When the cover 130 is disposed into the opening 210, the inner peripheral surface 220 overlaps the outer peripheral surface 133 of the cover 130 and surrounds the cover 130, and the water blocking surface 135 is located corresponding to the outer surface 200a of the case 200. The second annular track 132 coincides with the second annular groove 222, so as to together form a pipe-shaped space of a close path. In this case, the water blocking ring 120 is located between the outer peripheral surface 133 and the inner peripheral surface, and is filled in the pipe-shaped space together formed by the second annular track 132 and the second annular groove 222. A part of the water blocking ring 120 rising from the cover 130 is located in the second annular groove 222 and is squeezed, such that the water blocking ring 120 is normally compressed under a normal state.

The compressed water blocking ring 120 closely contacts a surface of the second annular groove 222, and forms a surface contact with the outer peripheral surface 220. Meanwhile, the compressed water blocking ring 120 also closely contacts a surface of the second annular track 132, and forms a surface contact with the inner peripheral surface 133, thereby achieving a sealing effect. The cross section of the second annular groove 222 matches with that of the water blocking ring 120, and the cross-sectional area thereof is smaller than that of the part of the water blocking ring 120 rising from the cover 220, such that the water blocking ring 120 is normally compressed in the second annular groove 222, thereby generating an enough contact pressure.

Figure 10:
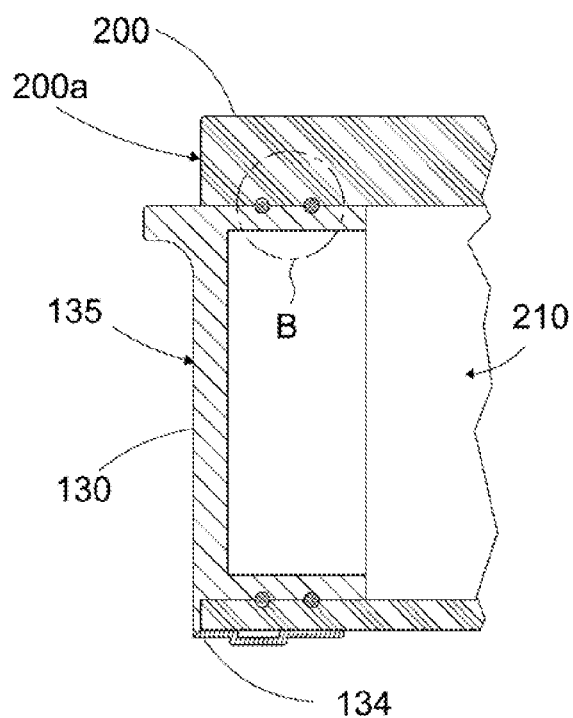
FIG. 10 is a cross-sectional view of the watertight door and the case according to the first embodiment of the present invention, in which the closed state of the watertight door is shown.
Figure 11:
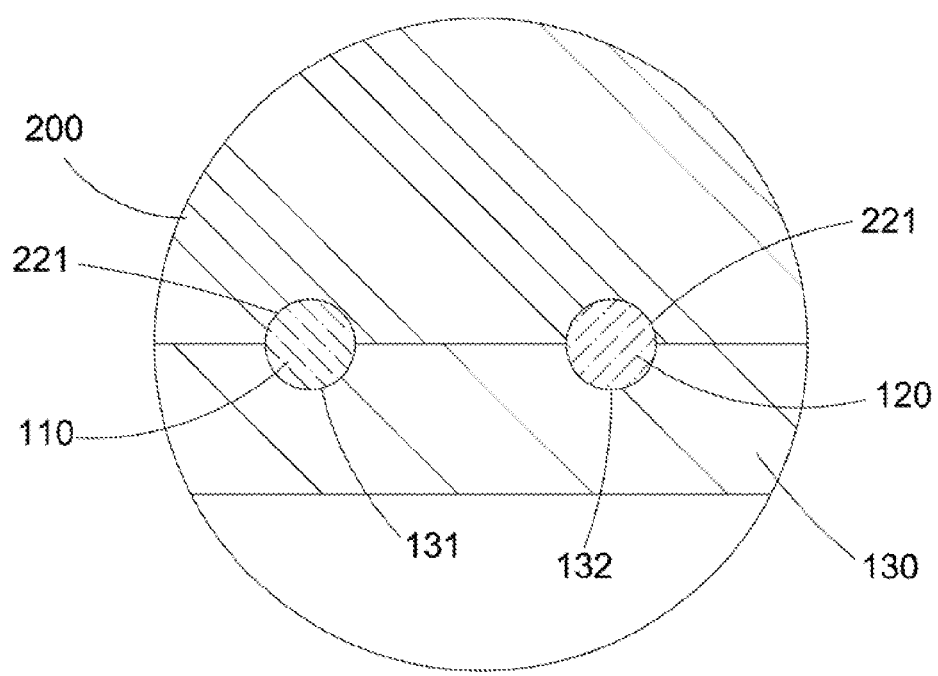
FIG. 11 is a schematic enlarged view of Region B in FIG. 10, in which a state of the water absorbing ring before absorbing water is shown.

Referring to FIGS. 10 and 11, when an exterior of the case 200 is sputtered by water or the case 200 is soaked in the water, small quantity of water may enter a gap between the cover 130 and the inner peripheral surface 220. The water absorbing ring 110 is located relatively outside, thus the water is absorbed by the water absorbent of the water absorbing ring 110 at first, such that the water absorbing ring 110 expands. Then, the first annular groove 221 is fully filled up with the expanded water absorbing ring 110, and the expanded water absorbing ring 110 closely forms the surface contact with the first annular groove 221, so as to from a block between the inner peripheral surface 220 and the outer peripheral surface 133. Meanwhile, the water absorbent may continuously absorb the leaked water before being saturated. The water blocking ring 120 may block the water before the water absorbing ring 110 is fully expanded, thereby preventing the water from directly entering the case 200 since the water absorbing ring 110 does not fully expand. In addition, the water absorbing ring 110 expands merely after absorbing the water. Therefore, during a process of disposing the cover 130 into the opening 210, the probability of damaging the water absorbing ring 110 is reduced, thereby ensuring a waterproofing effect.

Figure 12:
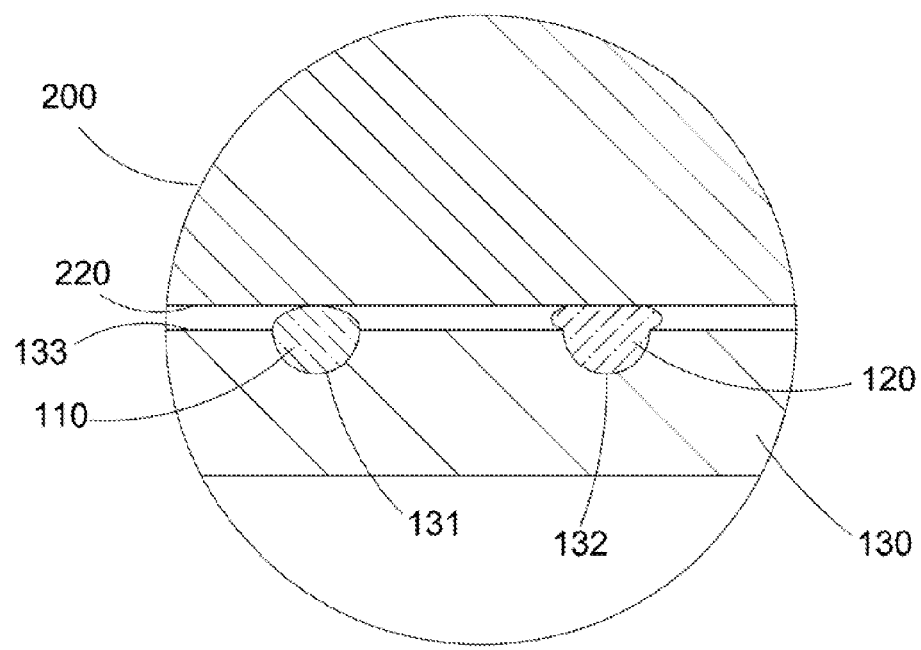
FIGS. 12 and 13 are partial cross-sectional views of another example of the waterproof assembly according to the first embodiment of the present invention.
Figure 13:
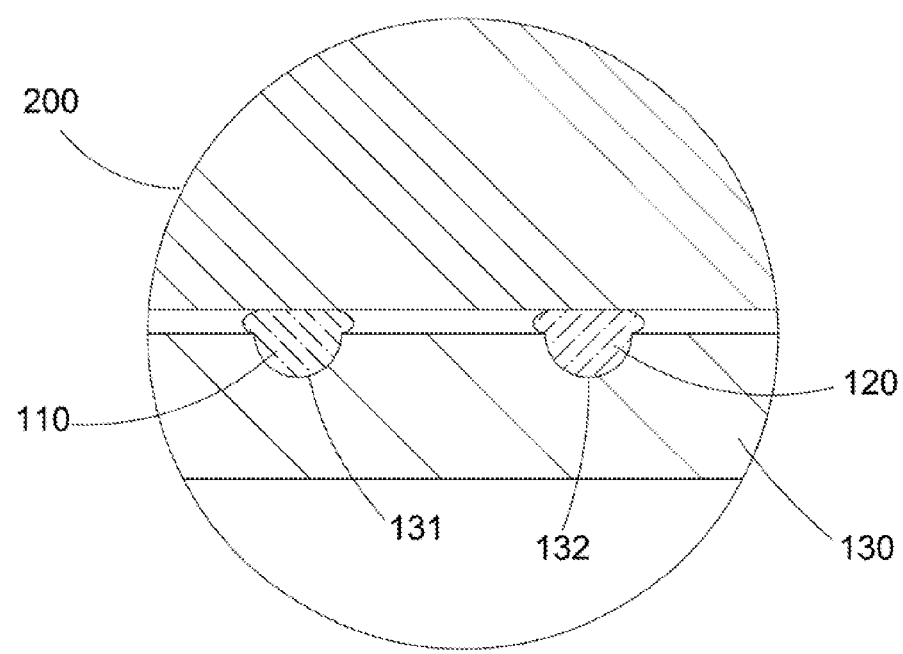

Referring to FIGS. 12 and 13, in the first embodiment, the first annular groove 221 and the second annular groove 222 may be omitted, and the water blocking ring 120 directly contacts the inner peripheral surface 220, and is normally compressed between the inner peripheral surface 220 and the outer peripheral surface 133, such that the water blocking ring 110 contacts the inner peripheral surface 220 in a surface contact manner. As shown in FIG. 12, before absorbing the water, the water absorbing ring 110 maintains not contacting the inner peripheral surface 220 or contacts the inner peripheral surface 220 at a low contact pressure. Referring to FIG. 13, when the water enters the gap between the cover 130 and the inner peripheral surface 220, the water absorbing ring 110 absorbs the water and expands, and meanwhile is compressed to be deformed, so as to contact the inner peripheral surface 220 in the surface contact manner.

In the embodiments of the present invention, the water absorbing ring 110 and the water blocking ring 120 are fitted to the outer peripheral surface 133 of the cover 130. Practically, as long as the water absorbing ring 110 and the water blocking ring 120 are fixed between the outer peripheral surface 133 of the cover 130 and the inner peripheral surface 220 of the opening 210, the waterproofing and sealing effects can be achieved.

Figure 14:
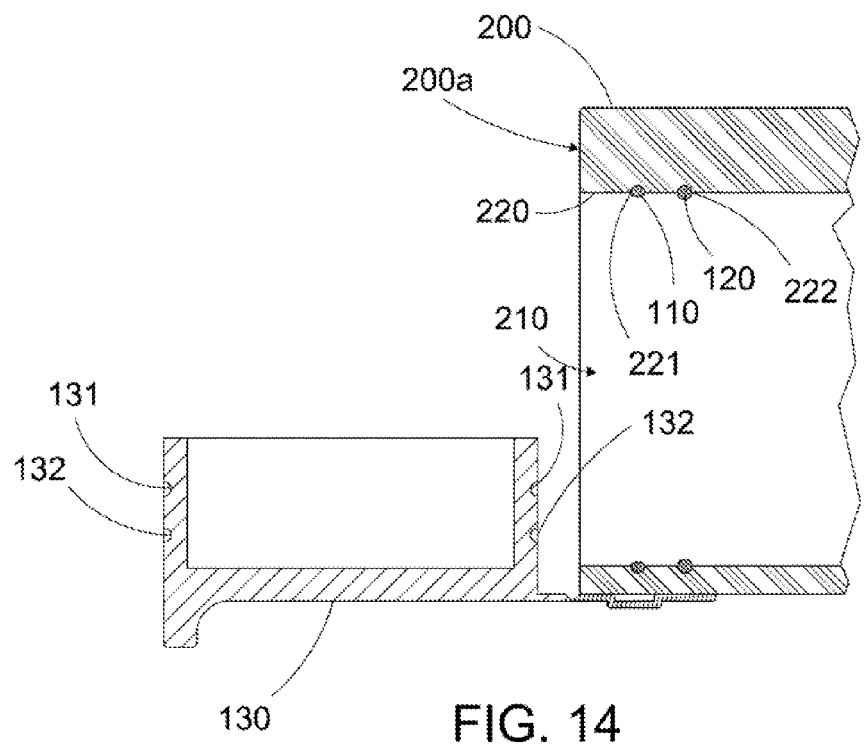
FIG. 14 is a cross-sectional view of another example of the waterproof assembly according to the first embodiment of the present invention.
Figure 15:
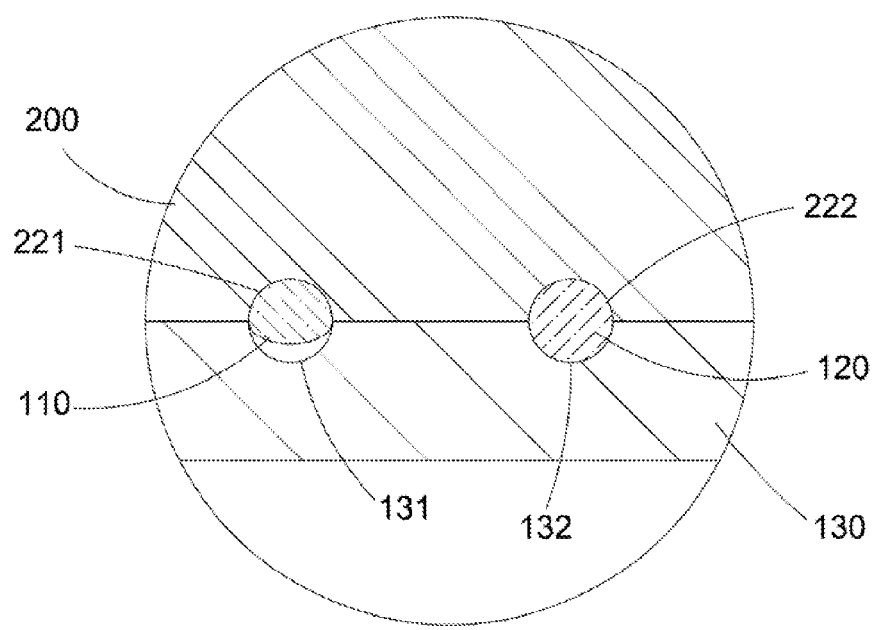
FIG. 15 is a partial cross-sectional view of another example of the waterproof assembly according to the first embodiment of the present invention.

Referring to FIGS. 14 and 15, an example of the first embodiment of the present invention is shown. The water absorbing ring 110 is disposed on the inner peripheral surface 220 of the opening 210, and is fixed in the first annular groove 221. The water blocking ring 120 is disposed on the inner peripheral surface 220, and is fixed in the second annular groove 222. Furthermore, the first annular groove 221 is located relatively near the outer surface 200a of the case 200, while the second annular groove 222 is located relatively distant from the outer surface 200a of the case 200.

The cover 130 is provided for being disposed into the opening 210, such that the inner peripheral surface 220 overlaps the outer peripheral surface 133 and surrounds the cover 130, and the water blocking surface 135 is located corresponding to outer surface 200a of the case 200. Therefore, the water absorbing ring 110 and the water blocking ring 120 are disposed between the outer peripheral 133 and the inner peripheral 220. The distance from the water blocking ring 120 to the water blocking surface 135 is larger than the distance from the water absorbing ring 110 to the water blocking surface 135. In this case, the part of the water absorbing ring 110 rising from the inner peripheral surface 220 is located in the first annular track 131, and the part of the water blocking ring 120 rising from the inner peripheral surface 220 is located in the second annular track 132. As the water absorbent expands, the first annular track 131 is fully filled up with the water absorbing ring 110, and the water absorbing ring 110 closely forms a surface contact with the first annular track 131, thereby generating the blocking effect. Meanwhile, the part of the water blocking ring 120 raising from the inner peripheral surface 220 is squeezed into the second annular track 132, and closely contacts the surface of the second annular track 132, such that the water blocking ring 120 is normally compressed, and the outer peripheral surface 133 of the cover 130 forms the surface contact with the inner peripheral surface 220 of the opening 210, thereby achieving the sealing effect.

In the embodiment of the present invention, besides absorbing the leaked water, the water absorbing ring may absorb water and expands at first, thereby directly achieving the blocking effect.

Figure 16:
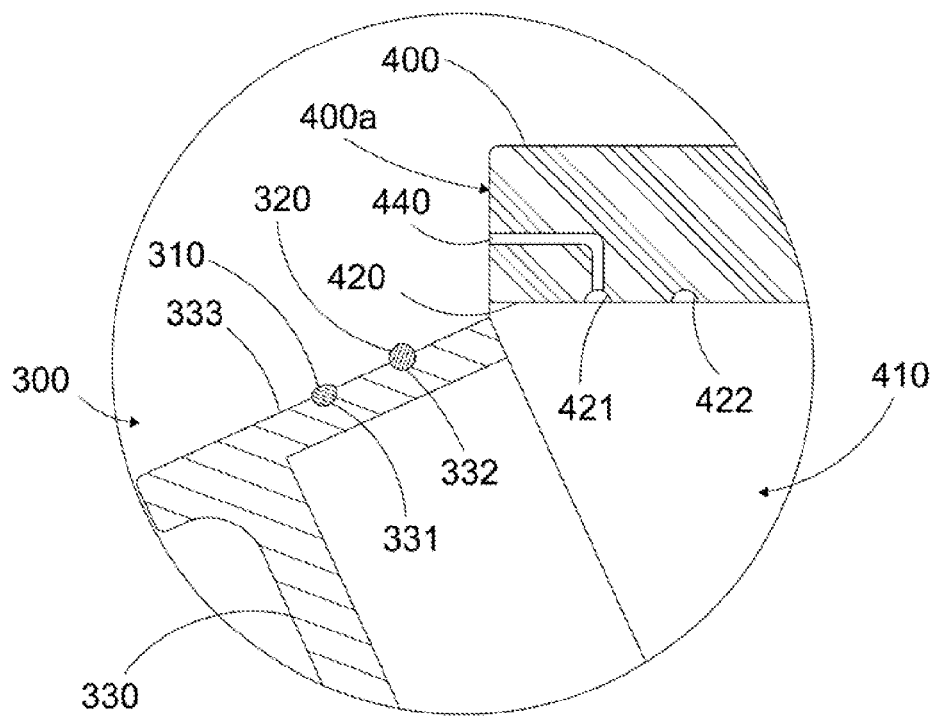
FIGS. 16 and 17 are cross-sectional views of a watertight door and a case according to a second embodiment of the present invention, in which an opening state and a closed state of the watertight door are shown.
Figure 17:
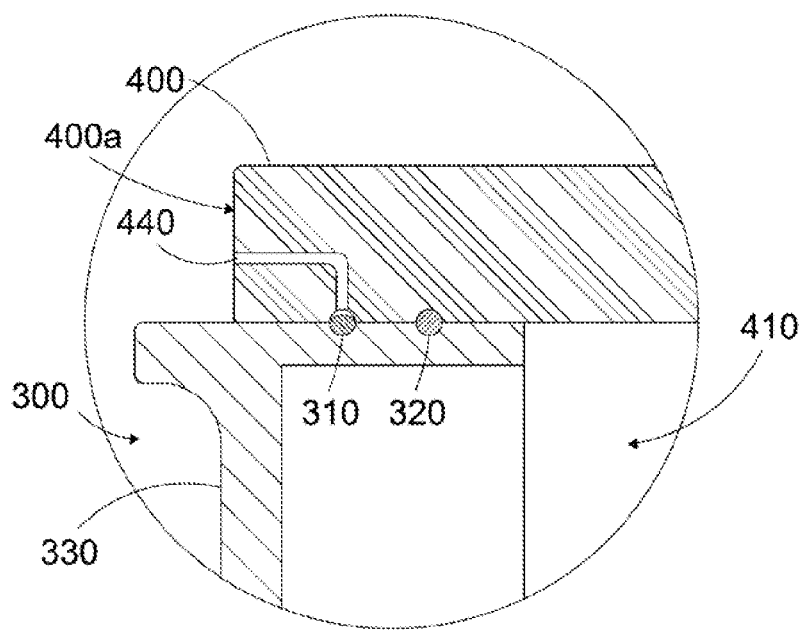

Referring to FIGS. 16 and 17, a waterproof assembly according to a second embodiment of the present invention is shown. The waterproof assembly includes a watertight door 300 and a case 400 of an electronic device. The case 400 has an outer surface 400a and an opening 410 is formed thereon, wherein the opening 410 is surrounded and defined by an inner peripheral surface 420. The inner peripheral surface 420 includes a first annular groove 421 and a second annular groove 422 formed thereon. The watertight door 300 is provided for being disposed in the opening 410 to seal the opening 410.

Referring to FIGS. 16 and 17, the case 400 further includes one or more fluid pipes 440 formed in the solid part of the case 400. The fluid pipe 440 connects the outer surface 400a of the case 400 and the inner peripheral surface 420 surrounding the opening 410. One end of the fluid pipe 440 connecting to the inner peripheral surface 420 is located in the first annular groove 421.

Referring to FIGS. 16 and 17, the watertight door 300 includes a water absorbing ring 310, a water blocking ring 320, and an cover 330. The cover 330 has a water blocking surface 335 and an outer peripheral surface 333 surrounding the water blocking surface 335. The outer peripheral surface 333 has a first annular track 331 and a second annular track 332, wherein the first annular track 331 is located relatively near the water blocking surface 335 while the second annular track 332 is relatively located distant from the water blocking surface 335.

Referring to FIGS. 16 and 17, the water absorbing ring 310 is fitted to the outer peripheral surface 333 of the cover 330, and is fixed in the first annular track 331, such that the water absorbing ring 310 is fixed on the outer peripheral surface 333. The water blocking ring 320 is fitted to the outer peripheral surface 333 of the cover 330, and is fixed in the second annular track 332, such that the water blocking ring 320 is fixed on the outer peripheral surface 333. Through the arrangement of the first annular track 331 and the second annular track 331, the distance from the water blocking ring 320 to the water blocking surface 335 is larger than the distance from the water absorbing ring 310 to the water blocking surface 335.

When the cover 330 is disposed into the opening 410, the outer peripheral surface 333 overlaps the inner peripheral surface 420. In this case, one end of the fluid pipe 440 connecting to the inner peripheral surface 420 corresponds to the water absorbing ring 320. If the exterior of the case 400 is sputtered by the water, the water may flow to the first annular groove 421 through the fluid pipe 440 and is absorbed by the water absorbing ring 310. The water absorbing ring 310 absorbs the water and expands, so that the first annular groove 421 and the first annular track 331 are fully filled up with the water absorbing ring 310, so as achieve a blocking effect. Meanwhile, the part of the water blocking ring 320 rising from the outer peripheral surface 333 of the cover 330 is squeezed in the second annular groove 422. The water blocking ring 320 is normally compressed in the second annular groove 422 and the second annular track 332, such that the water blocking ring 320 contacts the cover 330 and the inner peripheral surface 420 of the case 400 in the surface contact manner, thereby achieving the sealing effect.

As long as the water absorbing ring 310 and the water blocking ring 320 are disposed between the inner peripheral surface 420 of the case 400 and the outer peripheral surface 333 of the cover 330, and are compressed to form the surface contact, the waterproofing and sealing effects can be achieved. Therefore, the water absorbing ring 310 and the water blocking ring 320 according to the second embodiment may also be respectively fixed in the first annular groove 341 and the second annular groove 342 of the case 400, which are not limited to being fixed on the cover 330.

Figure 18:
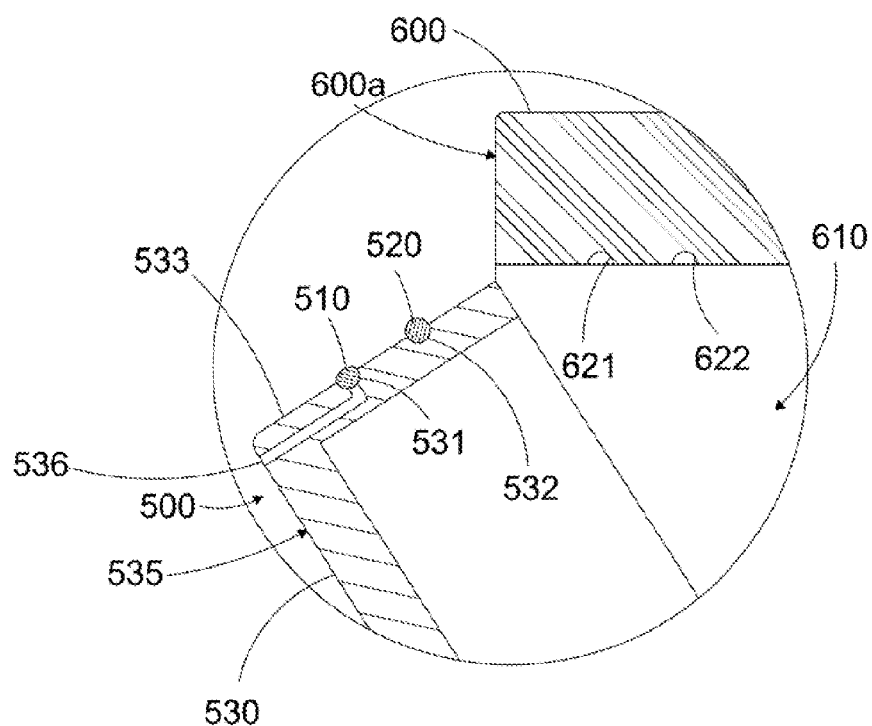
FIGS. 18 and 19 are cross-sectional views of a watertight door and a case according to a third embodiment of the present invention, in which an opening state and a closed state of the watertight door are shown.
Figure 19:
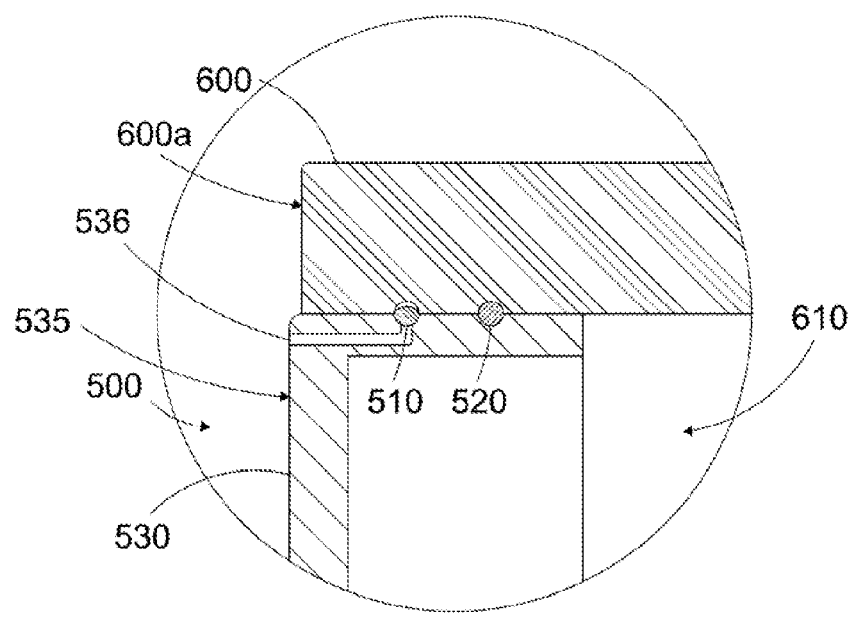

Referring to FIGS. 18 and 19, a waterproof assembly according to a third embodiment of the present invention is shown. The waterproof assembly includes a watertight door 500 and a case 600 of an electronic device. The case includes an outer surface 600a, and the outer surface 600a has an opening 610 formed thereon. The opening 610 is surrounded and defined by an inner peripheral surface 620. The watertight door 500 is used to close the opening 610 of the case 600. The watertight door 500 includes a water absorbing ring 510, a water blocking ring 520, and an cover 530.

The third embodiment is similar to the second embodiment, and the difference there-between is that, a solid part of the case 600 does not have a fluid pipe formed therein. Instead, the cover 530 further includes a plurality of fluid pipes 536, connecting the water blocking surface 535 and the outer peripheral surface 533 of the cover 530. One end of each fluid pipe 536 connecting to the outer peripheral surface 533 of the cover 530 is located in the first annular track 531 and corresponds to the water absorbing ring 520.

The second embodiment and the third embodiment may be combined, such that both the case and the cover have the fluid pipes, thereby accelerating an expansion rate of the water absorbing ring.

In each of the above embodiments of the present invention, the water absorbing ring is formed after mixing deformable material with water absorbent. However, the deformable material and the water absorbent may also be formed individually and then combined together, or may be simultaneously shaped into individual structures for being combined with each other.

Figure 20:
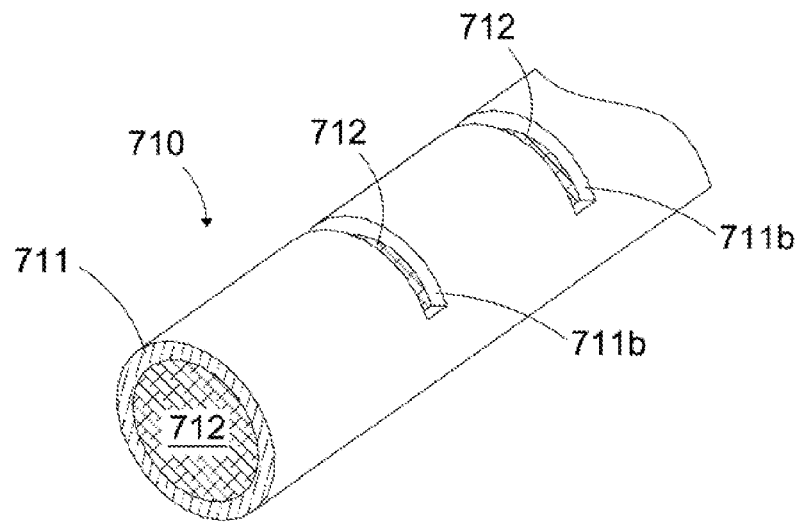
FIG. 20 is a partial perspective view of a water absorbing ring according to a fourth embodiment of the present invention.

Referring to FIG. 20, a water absorbing ring 710 according to a fourth embodiment of the present invention is shown. The water absorbing ring 710 is used in the watertight door according to one or more embodiments of the present invention. The water absorbing ring 710 includes an outer mantle layer 711 and a water absorbing layer 712.

The outer mantle layer 711 is made of deformable material, and has a plurality of slits 711b formed thereon. Each slits 710b partially cuts the outer mantle layer 511 along a radial direction of the water absorbing ring 710. A part of or all of the water absorbing layer 712 is made of a water absorbent, and the water absorbing layer 712 is wrapped by the outer mantle layer 711. Water runs through the outer mantle layer 711 through the slits 711b, and is absorbed by the water absorbing layer 712. The water absorbing layer 512 absorbs the water and expands, so as to press against the outer mantle layer 711 outwards, thereby increasing a cross-sectional area of the water absorbing ring 710.

Figure 21:
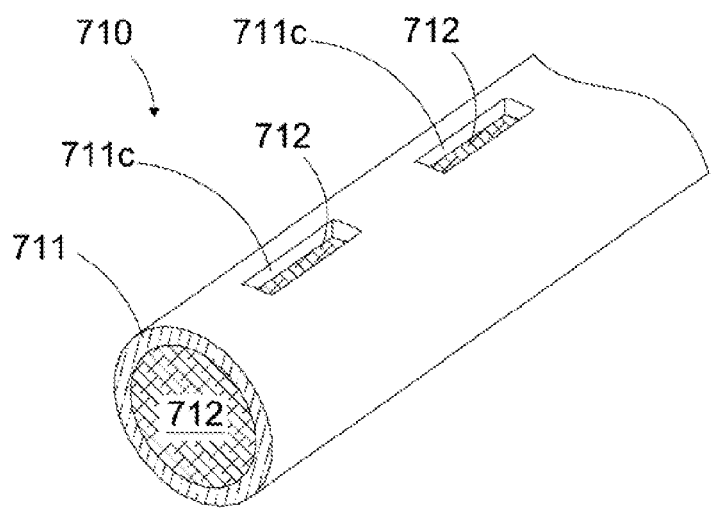
FIGS. 21 and 22 are partial perspective views of the water absorbing ring in different examples according to the fourth embodiment of the present invention.
Figure 22:
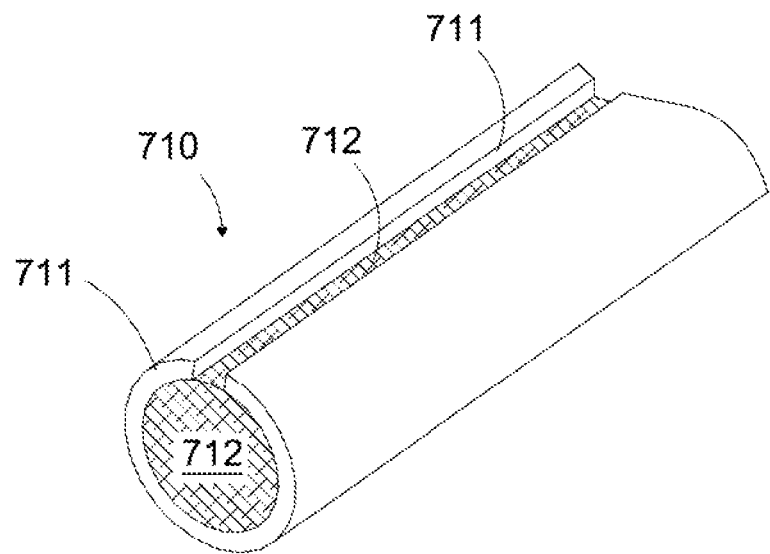

Referring to FIGS. 21 and 22, in the fourth embodiment, the slits 711c and 711d may cut the outer mantle layer 511 along an extending direction of the water absorbing ring 710, and the slits 711c and 711d may be configured successively or non-successively.

Figure 23:
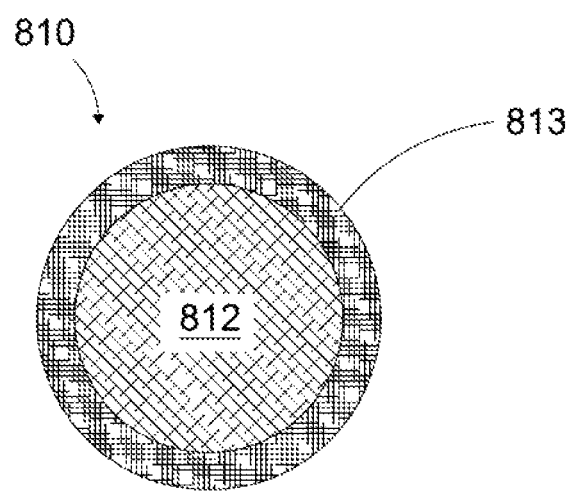
FIG. 23 is a cross-sectional view of a water absorbing ring according to a fifth embodiment of the present invention.

Referring to FIG. 23, a water absorbing ring 810 according to a fifth embodiment of the present invention is shown. The water absorbing ring 810 is used in the watertight door according to one or more embodiments of the present invention. The water absorbing ring 810 includes a water permeable layer 813 and a water absorbing layer 812.

The water permeable layer 813 is made of deformable material, and the water permeable layer 813 has a plurality of pores, so as to enable water to run through. The water permeable layer 813 is made of non-woven fabric or other fabric materials, which has characteristics of the deformable material, and has numerous tiny pores. A part of or the entire water absorbing layer 812 is made of a water absorbent. The water absorbing layer 812 is wrapped by the water permeable layer 813, and absorbs the water through the pores and expands. Since the material of the water permeable layer 813 is deformable, the water permeable layer 813 is deformed along with the water absorbing layer 612 after the water absorbing layer 812 absorbs the water and expands.

Figure 24:
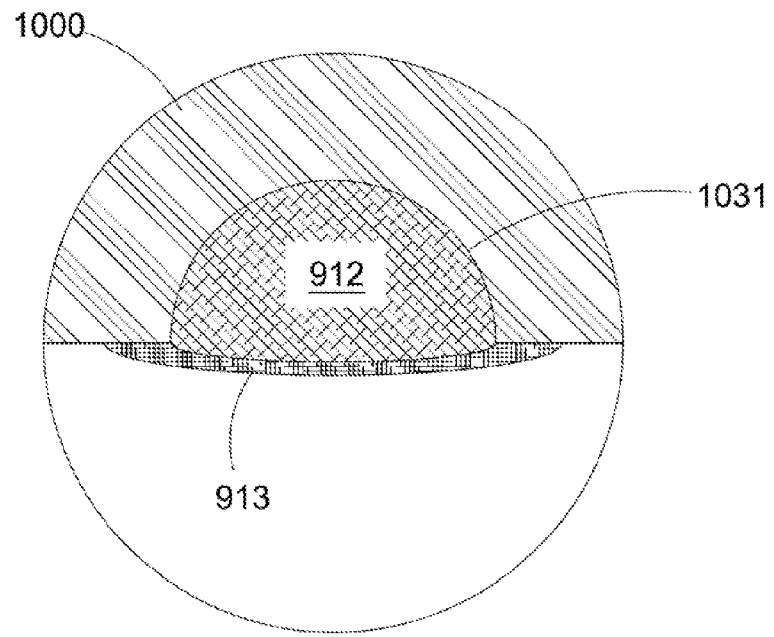
FIGS. 24 and 25 are partial cross-sectional views of a water absorbing ring in different examples according to a sixth embodiment of the present invention.
Figure 25:
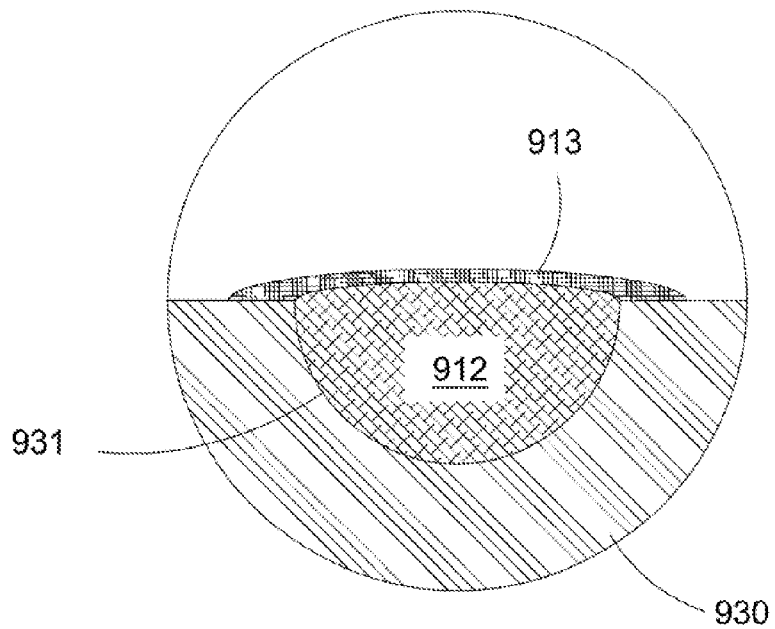

Referring to FIGS. 24 and 25, a water absorbing ring 910 according to a sixth embodiment of the present invention is shown. The water absorbing ring 910 is used in the watertight door according to one or more embodiments of the present invention. The water absorbing ring 910 includes a water permeable layer 913 and a water absorbing layer 912.

A part of or the entire water absorbing layer 912 is made of a water absorbent, and fills in a first annular groove 1031 of a case 1000 or a first annular track 931 of an cover 930. The water permeable layer 913 covers the first annular groove 1031 of the case 1000 or the first annular track 931 of the cover 930, so as to wrap the water absorbing layer 912, thereby preventing the water absorbing layer 912 from falling off. The water permeable layer 913 is made of a deformable material, and has a plurality of pores, so as to enable water to runs through. Since the material of the water permeable layer 913 is deformable, the water permeable layer 913 is deformed along with the water absorbing layer 912 after the water absorbing layer 912 absorbs the water and expands.

What is claimed is:

1. A watertight door, comprising:
a cover, having a water blocking surface and an outer peripheral surface surrounding an edge of the water blocking surface;
a water absorbing ring, fitted to the outer peripheral surface of the cover, and made of deformable material and water absorbent, for absorbing water to expand; and
a water blocking ring, made of elastic material, fitted to the outer peripheral surface of the cover, wherein a distance from the water blocking ring to the water blocking surface is larger than that from the water absorbing ring to the water blocking surface;
wherein the cover comprises at least one fluid pipe formed therein for connecting the water blocking surface of the cover to the outer peripheral surface, and one end of the fluid pipe located on the outer peripheral surface corresponds to the water absorbing ring.

2. The watertight door as claimed in claim 1, wherein the water absorbent is sodium polyacrylate or polyacrylate.

3. The watertight door as claimed in claim 1, wherein a first annular track and a second annular track are formed on the outer peripheral surface, the first annular track is located relatively near the water blocking surface while the second annular track is located relative distant from the water blocking surface, and the water absorbing ring is fixed in the first annular track while the water blocking ring is fixed in the second annular track.

4. The watertight door as claimed in claim 3, wherein the water absorbing ring comprises:
a water absorbing layer, filled in the first annular track, and at least one part of the water absorbing layer being made of the water absorbent; and
a water permeable layer, made of the deformable material, having a plurality of pores, covered on the first annular track to fix the water absorbing layer, and provided for the water to permeate through the water permeable layer to be absorbed by the water absorbing layer.

5. The watertight door as claimed in claim 3, wherein the cover comprises at least one fluid pipe formed therein for connecting the water blocking surface to the outer peripheral surface, and one end of the fluid pipe on the outer peripheral surface is disposed in the first annular track.

6. The watertight door as claimed in claim 1, wherein the water absorbing ring is formed after mixing the deformable material with the water absorbent, and the deformable material is formed into porous structure.

7. The watertight door as claimed in claim 1, wherein the water absorbing ring comprises:
an outer mantle layer, made of the deformable material, and having at least one slit for the water to permeate; and
a water absorbing layer, wrapped by the outer mantle layer, wherein at least one part of the water absorbing layer is made of the water absorbent to absorb the water permeating the outer mantle layer through the slit and to expand.

8. The watertight door as claimed in claim 1, wherein the water absorbing ring comprises:
a water permeable layer, made of the deformable material, and having a plurality of pores for the water to permeate; and
a water absorbing layer, wrapped by the water permeable layer, wherein at least one part of the water absorbing layer is made of the water absorbent to absorb the water permeating the water permeable layer and to expand.

9. A waterproof assembly, comprising:
a case, having an outer surface with an opening formed thereon, wherein the opening is defined by an inner peripheral surface, and wherein an annular groove is provided in the inner peripheral surface;
a cover configured to be selectively receivable into the opening to close the opening and removable from the opening to expose the opening, and having a water blocking surface and an outer peripheral surface surrounding the water blocking surface, wherein the outer peripheral surface is provided with an annular track, and wherein the annular track is a recess formed in the outer peripheral surface, arranged such that when the cover is received in the opening, the outer peripheral surface overlaps and contacts the inner peripheral surface of the opening, the water blocking surface is located corresponding to the outer surface of the case, and the annular groove coincides with the annular track to form an annular opening;

a water absorbing ring extending from a top to a bottom thereof, the bottom of the water absorbing ring being located in the annular track, and made of deformable material and water absorbent, proportioned and arranged such that when the cover is received in the opening and before the water absorbing ring has absorbed water, a cross-sectional area of a portion of the water absorbing ring rising out of the annular track into the annular groove is less than the cross-sectional area of the annular groove such that a gap is left between the top of the water absorbing ring and a portion of the inner peripheral surface defining the annular groove, and after the water absorbing ring has absorbed water, the water absorbing rings expands to fill the entire annular opening; and a water blocking ring, made of an elastic material, and located between the outer peripheral surface and the inner peripheral surface so as to be compressed to contact the inner peripheral surface and the outer peripheral surface when the cover is received in the opening.

10. The waterproof assembly as claimed in claim 9, wherein the water absorbent is sodium polyacrylate or polyacrylate.

11. The waterproof assembly as claimed in claim 10, wherein the water absorbing ring is formed after mixing the deformable material with the water absorbent, and the deformable material is formed into a porous structure.

12. A waterproof assembly, comprising:
a case, having an outer surface with an opening formed thereon, wherein the opening is defined by an inner peripheral surface;
a cover for being disposed into the opening, and having a water blocking surface and an outer peripheral surface surrounding the water blocking surface, when the cover is placed in the opening, the outer peripheral surface overlaps the inner peripheral surface of the opening and the water blocking surface is located corresponding to the outer surface of the case;
a water absorbing ring, located between the outer peripheral surface and the inner peripheral surface, and made of deformable material and water absorbent, for absorbing water to expand and tightly contacting the inner peripheral surface and the outer peripheral surface; and
a water blocking ring, made of an elastic material, and located between the outer peripheral surface and the inner peripheral surface to be normal compressed to contact the inner peripheral surface and the outer peripheral surface when the cover is placed in the opening;
wherein the case comprises at least one fluid pipe formed therein for connecting to the outer surface and the inner peripheral surface and one end of the fluid pipe on the inner peripheral surface corresponds to the water absorbing ring.

13. The waterproof assembly as claimed in claim 12, wherein a first annular track and a second annular track are formed on the outer peripheral surface the first annular track is located relatively near the water blocking surface while the second annular track is located relatively distant from the water blocking surface, and the water absorbing ring is fixed in the first annular track while the water blocking ring is fixed in the second annular track.

14. The waterproof assembly as claimed in claim 13, wherein the inner peripheral surface comprises:
a first annular groove, coinciding with the first annular track, when the cover is placed in the opening, a part of the water absorbing ring raising from the outer peripheral surface is located in the first annular groove; and
a second annular groove, coinciding with the second annular track, when the cover is placed in the opening, a part of the water blocking ring raising from the outer peripheral surface is located in the second annular groove and is normally compressed.

15. The waterproof assembly as claimed in claim 12, wherein the inner peripheral surface comprises a first annular groove and a second annular groove formed thereon, and the water absorbing ring is fixed in the first annular groove while the water blocking ring is fixed in the second annular groove.

16. The waterproof assembly as claimed in claim 15, wherein the outer peripheral surface further comprises:
a first annular track, coinciding with the first annular groove, when the cover is placed in the opening, a part of the water absorbing ring raising from the inner peripheral surface is located in the first annular track; and
a second annular track, coinciding with the second annular groove, when the cover is placed in the opening, a part of the water blocking ring raising from the inner peripheral surface is located in the second annular track and is normally compressed.

17. The waterproof assembly as claimed in claim 9, wherein the water absorbing ring is formed after mixing the deformable material with the water absorbent, and the deformable material is formed into a porous structure.

18. The waterproof assembly as claimed in claim 9, wherein the water absorbing ring comprises:
an outer mantle layer, made of the elastic material, and having at least one slit for the water permeating the outer mantle layer through the outer mantle layer; and
a water absorbing layer, wrapped by the outer mantle layer, wherein at least one part of the water absorbing layer is made of the water absorbent to absorb the water permeating the outer mantle layer through the slit and to expand.

19. The waterproof assembly as claimed in claim 9, wherein the water absorbing ring comprises:
a water permeable layer, made of the deformable material, and having a plurality of pores for the water permeating the water permeable layer through the pores; and
a water absorbing layer, wrapped by the water permeable layer, wherein at least one part of the water absorbing layer is made of the water absorbent to absorb the water permeating the water permeable layer through the pores and to expand.

20. A waterproof assembly, comprising:
a case, having an outer surface with an opening formed thereon, wherein the opening is defined by an inner peripheral surface, and wherein an annular groove is provided in the inner peripheral surface;
a cover configured to be selectively receivable into the opening to close the opening and removable from the opening to expose the opening, and having a water blocking surface and an outer peripheral surface surrounding the water blocking surface, wherein the outer peripheral surface is provided with an annular track, and wherein the annular track is a recess formed in the outer peripheral surface, arranged such that when the cover is received in the opening, the outer peripheral surface overlaps and contacts the inner peripheral surface of the opening, the water blocking surface is located corresponding to the outer surface of the case, and the annular groove coincides with the annular track to form an annular opening;

a water absorbing ring extending from a top to a bottom thereof, the top of the water absorbing ring being located in the annular groove, and made of deformable material and water absorbent, proportioned and arranged such that when the cover is received in the opening and before the water absorbing ring has absorbed water, a cross-sectional area of a portion of the water absorbing ring extending out of the annular groove into the annular track is less than the cross-sectional area of the annular track such that a gap is left between the bottom of the water absorbing ring and a portion of the outer peripheral surface defining the annular track, and after the water absorbing ring has absorbed water, the water absorbing rings expands to fill the entire annular opening; and a water blocking ring, made of an elastic material, and located between the outer peripheral surface and the inner peripheral surface so as to be compressed to contact the inner peripheral surface and the outer peripheral surface when the cover is received in the opening.

* * * * *